(12) United States Patent
Lee et al.

(10) Patent No.: US 8,547,127 B2
(45) Date of Patent: Oct. 1, 2013

(54) PROBE BLOCK

(75) Inventors: Yong Goo Lee, Songpa-gu (KR); Maeng Youl Lee, Yangcheon-gu (KR)

(73) Assignee: Gigalane Co. Ltd, Gyeonggi-Do (KR)

( * ) Notice: Subject to any disclaimer, the term of this patent is extended or adjusted under 35 U.S.C. 154(b) by 0 days.

(21) Appl. No.: 13/203,641

(22) PCT Filed: Feb. 22, 2010

(86) PCT No.: PCT/KR2010/001063
§ 371 (c)(1),
(2), (4) Date: Aug. 26, 2011

(87) PCT Pub. No.: WO2010/098558
PCT Pub. Date: Sep. 2, 2010

(65) Prior Publication Data
US 2012/0074979 A1    Mar. 29, 2012

(30) Foreign Application Priority Data
Feb. 26, 2009  (KR) .................. 10-2009-0016116

(51) Int. Cl.
*G01R 1/067* (2006.01)

(52) U.S. Cl.
USPC ............ 324/755.01; 324/755.11; 324/756.04; 324/754.03

(58) Field of Classification Search
USPC ............ 324/756.01–756.07, 755.01, 755.11, 324/754.03; 439/66; 438/14–18
See application file for complete search history.

(56) References Cited

U.S. PATENT DOCUMENTS

| | | | |
|---|---|---|---|
| 6,356,089 B2 * | 3/2002 | Bayer et al. | 324/750.25 |
| 6,411,112 B1 * | 6/2002 | Das et al. | 324/754.2 |
| 6,776,624 B2 | 8/2004 | Suematsu | 439/71 |
| 6,967,492 B2 * | 11/2005 | Tsui et al. | 324/755.05 |
| 7,417,447 B2 * | 8/2008 | Kister | 324/750.16 |
| 7,498,665 B2 * | 3/2009 | Alabin et al. | 257/670 |
| 2007/0145991 A1 * | 6/2007 | Yoshida | 324/754 |

FOREIGN PATENT DOCUMENTS

| | | |
|---|---|---|
| JP | 10-096747 | 4/1998 |
| JP | 2002-365310 | 12/2002 |
| JP | 2003-007412 | 1/2003 |
| JP | 2007-121223 | 5/2007 |
| KR | 10-2006-0016833 | 2/2006 |

OTHER PUBLICATIONS

International Search Report (ISR) in PCT/KR2010/001063 dated Oct. 6, 2010.

* cited by examiner

*Primary Examiner* — Arleen M Vazquez
(74) *Attorney, Agent, or Firm* — Harness, Dickey & Pierce, P.L.C.; Anthony G. Fussner; Kisuk Lee

(57) ABSTRACT

There is provided a probe block comprising a probe including first contact portions, second contact portions, and beams connecting the first contact portion to the second contact portion and a guide where the probe is inserted and supported, wherein the probe block is installed in a probe card for inspecting a semiconductor chip.

7 Claims, 6 Drawing Sheets

US 8,547,127 B2

PROBE BLOCK

CROSS-REFERENCE TO RELATED APPLICATIONS

This application is a national phase application of PCT Application No. PCT/KR2010/001063 filed on Feb. 22, 2010, which claims the benefit and priority to Korean Patent Application No. 10-2009-0016116 filed Feb. 26, 2009. The entire disclosures of the applications identified in this paragraph are incorporated herein by references.

TECHNICAL FIELD

The present invention relates to a semiconductor inspection device, and more particularly, to a structure of a probe block mounted on a probe card.

BACKGROUND ART

When manufacturing electrical circuit devices such as semiconductor integrated circuit devices, it is inspected during or after a process of manufacturing devices and before a packaging process whether the entire or partial electric properties of devices are formed to be identical to a design thereof.

A device used in such inspections is a probe station, and a probe card is installed in the probe station. The probe card transfers all kinds of electric signals of the probe station to pads of devices formed on a semiconductor wafer, which are objects of measurement.

The probe card is formed of two parts. One is a circuit board structurally supporting a probe and including a circuit connecting the probe station and the probe and formed on the board. Another is a probe installed on the board, which electrically connects the circuit board to pads of a device for measurement.

A device for measurement is put on a chuck and the chuck moves in a direction of X and Y axes in such a way that a probe of a probe card are to be matched with pads of the device for measurement. The chuck moves in a direction of Z axis in such a way that the probe is in contact with the pads of the device for measurement.

After that, an electric signal generated in the probe station is transferred to the circuit board of the probe card, passes through the probe via an electric line connecting the circuit board to an end of the probe, and transmitted to the device for measurement, thereby performing a test.

Recently, electrical contact points of semiconductor devices become very smaller in such a way that, in general, several tens to several hundreds of pads for electrical contact points are arranged with a pitch less than several ten micrometers therebetween per a device.

Recently, since probe cards measure several devices at the same time, there are required a large numbers of probes. Also, due to a very small pitch between pads of a device, a pitch between probes in contact with pads is also very small. However, it is required a high degree of process technology to embody probe blocks with a fine pitch and there are many problems such as costs and time for embodying.

FIG. 1 is a configuration view illustrating a semiconductor chip 100 with a staggered pad arrangement.

In a chip having an in-line pad structure, pads are arranged in a row. In the semi-conductor chip 100 with a staggered pad arrangement, pads P11 and P12 are arranged in a double row in a series of zigzags to provide largest number of pads P11 and P12 in a small size.

FIG. 2 is a view illustrating a probe block for test, overlapping the semiconductor chip 100 of FIG. 1.

Referring to FIG. 2, there are shown pads arranged in one side of the semiconductor chip 100 and guide holes where probes (not shown) of a probe block (not shown) are overlapped upon the pads.

In FIG. 2, pads are arranged in a series of zigzags to increase a degree of integration of the pads in the semiconductor chip with a staggered pad arrangement and there are shown a connection structure of a first pad P11 in a first row and a first pad P21 in a second row.

There are shown an upper hole where a first contact portion of the probe is inserted in and protruded to be in contact with the first pad P11 of the first row, a lower hole HD11 where a second contact portion of the probe is inserted in and protruded to receive a test signal from the opposite of the upper hole HU11, and a center hole HC1 where a beam connecting the first contact portion to the second contact portion.

Also, there is shown a probe having the same structure to be in contact with the first pad P21 of the second row. That is, there are shown an upper hole HU21, a lower hole HD21, and a center hole HC2 where the probe for being in contact with the first pad P21 of the second row is inserted in.

In contact points C11 and C21, the respective probes corresponding to the first pad P11 in the first row and the first pad P21 in the second row are in contact therewith.

When a pitch between neighboring pads in an in-line pad structure in which pads are arranged in a row is 50 micrometers, either of a pitch between probes in contact with the respective pads or a pitch between holes where probes are inserted in is also 50 micrometers.

However, in the semiconductor chip with the staggered pad arrangement in FIG. 2, since pads crisscross one another, a pitch between the pad P11 and the pad P21 is half that of the in-line pad structure, that is 25 micrometers.

Accordingly, pitches between holes such as upper holes, lower holes, and a center hole where the probes contacting with the pad P11 and P21, respectively, are inserted are determined to be 25 micrometers and widths of respective holes become very smaller to 10 micrometers, which makes manufacturing difficult. Also, a depth D of a wall between holes is very small, which makes a structure thereof become weak.

FIG. 3 is a three-dimensional perspective view illustrating a probe block for the semiconductor chip with a staggered pad arrangement of FIG. 2. FIG. 4 is a top view illustrating the probe block of FIG. 3.

As described above with reference to FIG. 2, to test pads P11 and P21 arranged in a series of zigzags, upper holes HU11 and HU21 formed on a guide of the probe block are formed in a series of zigzags. Also, probes PB1 and PB2 are inserted in the upper holes HU11 and HU21, respectively. In FIG. 3, the upper hole HU21, a center hole HC2, and a lower hole HD2 where the probe PB2 is inserted.

FIG. 4 is a top view illustrating the probe block of FIG. 3, in which it may be known that holes where respective probes are inserted are formed in a series of zigzags, identical to the arrangement of pads.

When probes to be in contact with pads arranged inside of two rows are arranged inside and probes to be in contact with pads arranged outside are arranged outside to increase a pitch between holes where a probe is inserted, in an area 40 of FIG. 4, it is impossible to form a probe block due to an overlap between probes in contact with pads arranged in a top in a horizontal direction and probes in contact with pads arranged vertically.

Accordingly, when holes where probes are inserted in are formed on a guide as shown in FIG. 4, it becomes difficult to manufacture probe blocks for testing semi-conductor chips with a staggered pad structure or a structure in which pads are arranged in a plurality of rows, due to decreased pitch of holes where probes are inserted in.

DISCLOSURE OF INVENTION

Technical Problem

The present invention provides a probe block for fine pitch, the probe block including a vertical probe having a thin flat panel structure and a guide to be in contact with pads arranged in several rows.

Solution to Problem

According to an aspect of the present invention, there is provided a probe block including a probe formed of first contact portions, second contact portions, and beams connecting the first contact portion to the second contact portion and a guide supporting the probe inserted therein, the probe block installed in a probe card inspecting a semiconductor chip.

The guide includes a first part formed of a plurality of upper holes wherein the first contact portions of the probe are inserted therein to penetrate, a second part formed of a plurality of lower holes wherein the second contact portions of the probe are inserted therein to penetrate, and a third part including a center hole wherein beams of the respective probes inserted in the upper holes and the lower holes are commonly inserted, the third part disposed between the first part and the second part. The upper holes and the lower holes are located on a plane vertically extended from the center hole.

The upper holes and the lower holes wherein the probes whose beams are commonly inserted in the center hole are inserted form an upper hole set and a lower hole set, respectively. In this case, in the probe block, a plurality of the upper hole sets are arranged corresponding to pads of the semiconductor chip and a plurality of the lower hole sets are arranged corresponding to pads of a space transformer.

An arrange direction of the respective upper holes belonging to the upper hole set is identical to a direction of a straight line formed by connecting contact points of the first contact portion, corresponding to the pads of the semiconductor chip, and an arrange direction of the lower holes belonging to the lower hole set is identical to that of the upper holes.

When the semiconductor chip has a staggered pad structure, the upper hole set and the lower hole set are formed of two upper holes and two lower holes, respectively. The center hole is in a panel shape in which the beams are inserted and a space between neighboring probes is blocked in such a way that the probes only move vertically.

The third part including a center hole is formed by assembling one or more unit elements.

The first part is formed in a single body with the third part or the second part is formed in a single body with the third part. Also, the first to third blocks may be formed in a single body.

The beams commonly inserted in the center hole electrically open to one another when corresponding first contact portions are in contact with the pads, though the first contact portions vertically move or there is generated a deformation in the beams.

The first contact portions, the second contact portions, and the beams of the probe have a panel-shaped structure, in which thresholds are formed to prevent the first contact portions from being protruded further than the upper holes on a portion where the first contact portions are connected to the beams, to planarize the first contact portions.

Advantageous Effects of Invention

As described above, in the case of the probe block according to an embodiment of the present invention, a thin probe is supported by a guide and in contact with a pad without a short-circuit with an adjacent probe, thereby embodying a fine pitch. When manufacturing a probe block in contact with pads arranged in two or more rows, a pitch between holes of a guide may be identical to a pitch between guide holes for testing a chip with an in-line structure.

BRIEF DESCRIPTION OF DRAWINGS

FIG. 9 is a perspective view illustrating the probe block cut along a line B to B' of

FIG. 8;

BEST MODE FOR CARRYING OUT THE INVENTION

Figure 1:
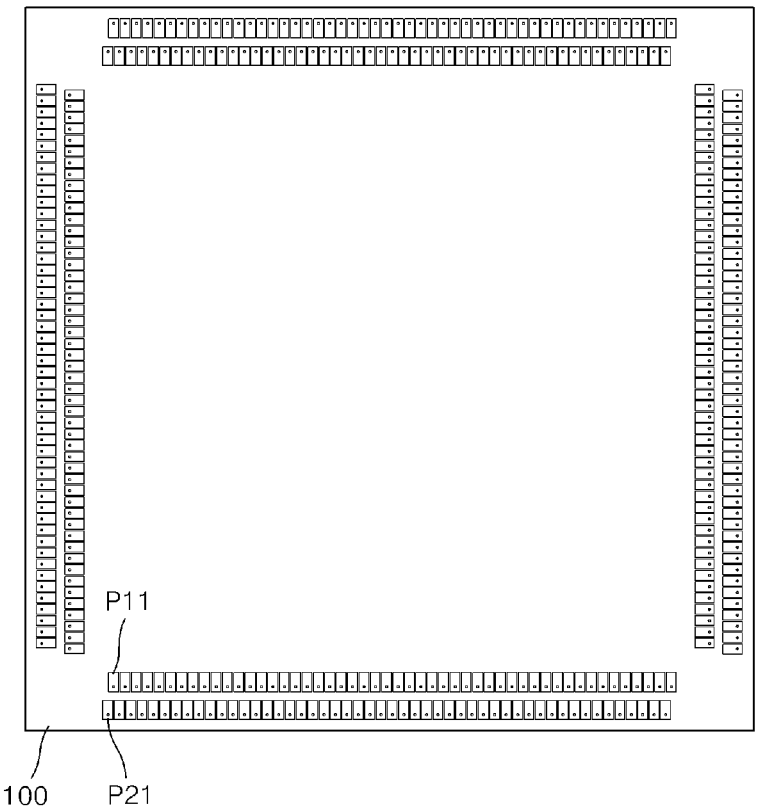
FIG. 1 is a configuration view illustrating a semiconductor chip with a staggered pad arrangement.

To fully understand advantages of operations of the present invention and the objects obtained by embodiments of the present invention, it is required to refer to attached drawings illustrating preferable embodiments of the present invention and contents shown in the drawings.

Hereinafter, the preferable embodiments of the present invention will be described in detail with reference to the attached drawings. The same reference numerals shown in each drawing indicate the same elements.

Figure 5:
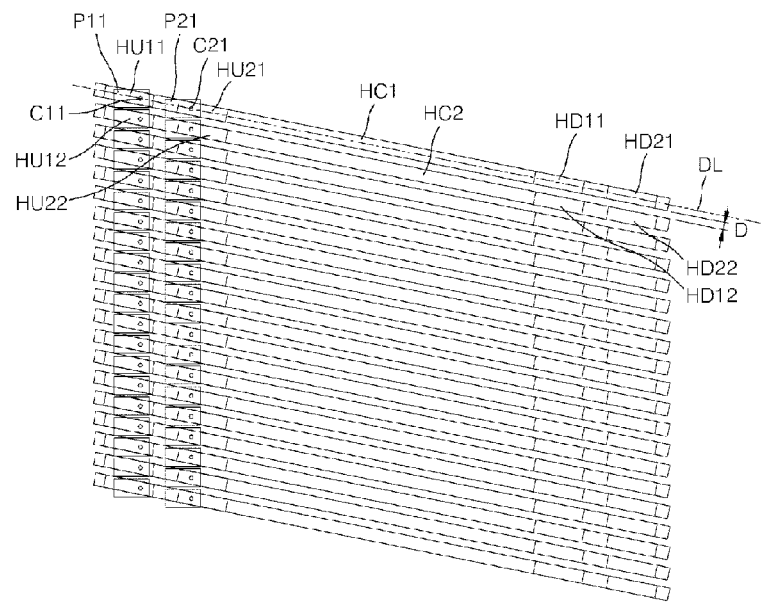
FIG. 5 is a concept view illustrating relationship between guide holes of a probe block according to an embodiment of the present invention and pads.

FIG. 5 is a concept view illustrating relationship between guide holes of a probe block according to an embodiment of the present invention and pads.

FIG. 5 is a projected top view illustrating a semiconductor chip with a staggered pad arrangement and the guide holes of the probe block for testing the semiconductor chip.

Figure 6:
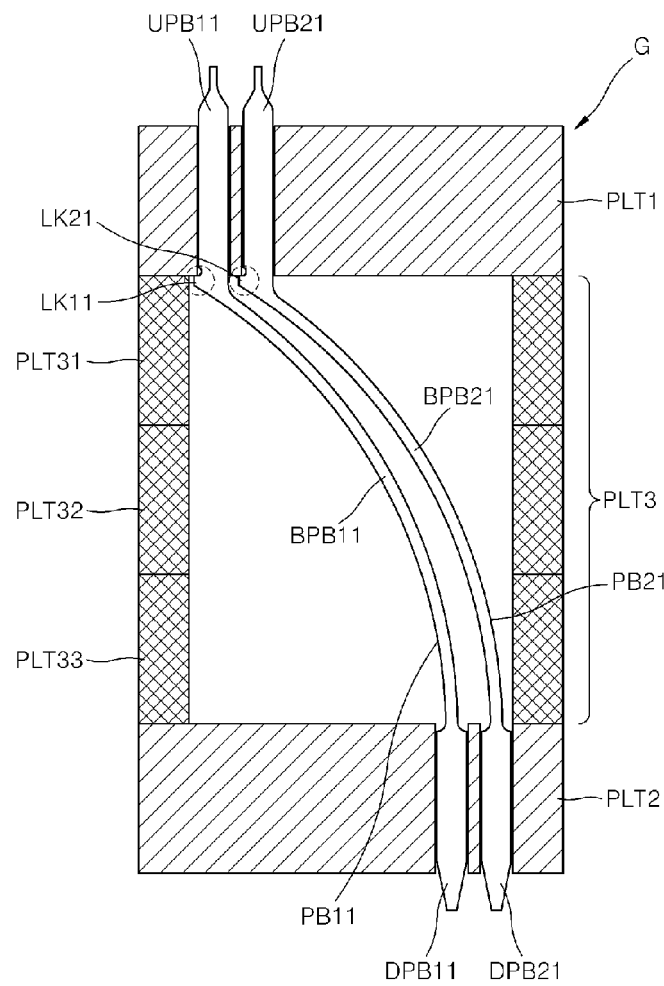
FIG. 6 is a side cross-sectional view illustrating a structure of guides of the probe block of FIG. 5 and probes inserted therein.

FIG. 6 is a side cross-sectional view illustrating a structure of guides of the probe block of FIG. Sand probes inserted therein.

Figure 7:
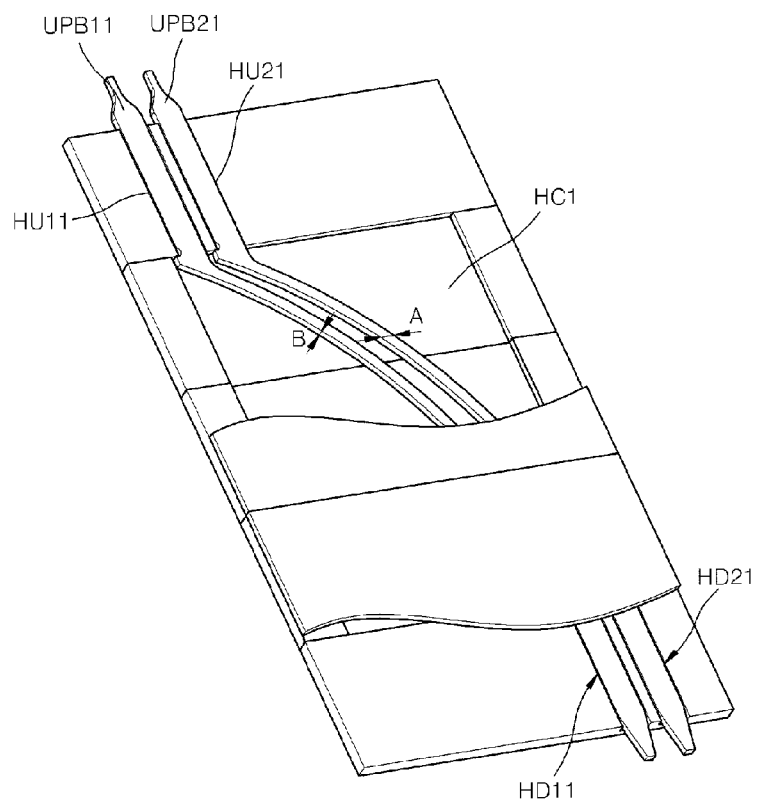
FIG. 7 is a three-dimensional perspective view illustrating the guides and the probes of FIG. 6.

FIG. 7 is a three-dimensional perspective view illustrating the guides and probes shown in FIG. 6.

Hereinafter, a structure and operations of the probe block according to an embodiment of the present invention will be described with reference to FIGS. 5 to 7.

The probe block according to an embodiment of the present invention includes the probes and the guides.

The probe includes first contact portions, second contact portions, and beams connecting the first contact portion to the second contact portion and are inserted in the guide and supported thereby. The probe block including the guide and the probe is installed in a probe card for inspecting a semiconductor chip. The probe block may be applied to all of semiconductor chips for test, in which pads of are arranged in two or more rows.

For example, the probe block may be applied to a wafer level chip scale packaging (WLCSP) chip. Hereinafter, for convenience of description, a chip having a staggered pad structure in which pads are arranged in two rows will be described.

In the present embodiment, probes PB11 and PB21 testing a first pad P11 of a first row and a first pad P21 of a second row are inserted in the same center hole HC1 of a guide G. In more detail, beams BPB11 and BPB21 of the probes PB11 and PB21 are commonly inserted in a center hole HC1 of the guide G and are not electrically connected to each other.

The guide G of the probe block includes a first part PLT1 formed of a plurality of upper holes HU11 and HU21 wherein the first contact portions UPB11 and UPB21 of the probes PB11 and PB21 are inserted therein to penetrate, a second part PLT2 formed of a plurality of lower holes HD11 and HD21 wherein the second contact portions DPB11 and DPB21 of the probe are inserted therein to penetrate, and a third part PLT3 including the center hole HC1 wherein beams BPB11 and BPB21 of the respective probes PB111 and PB21 inserted in the upper holes HU11 and HU21 and the lower holes HD11 and HD21 are commonly inserted, the third part PLT3 disposed between the first part PLT1 and the second part PLT2. The upper holes HU11 and HU21 and the lower holes HD11 and HD21 are located on a plane vertically extended from the center hole HC1.

Though there is shown the center hole HC1 in which the beams BTB11 and BTB21 of the plurality of the probes PB11 and PB21 are commonly inserted in FIG. 5, a structure of the probe block is not limited to such HC1 structure. The probe block may have a center hole in which only one beam is inserted according to the shape of arranging pads of a chip.

The upper holes HU11 and HU21 and the lower holes HD11 and HD21 where the first contact portions UPB11 and UPB21 and the second contact portions DPB11 and DPB21 of the probes PB11 and PB21 where the beams BPB11 and BPB21 are commonly inserted in the center hole HC1 form an upper hole set and a lower hole set, respectively. The probe block is disposed in such a way that a plurality of the upper hole sets and a plurality of lower hole sets correspond to pads of a semiconductor chip.

That is, in FIG. 5, the two upper holes HU11 and HU21 form one upper hole set and the two lower holes HD11 and HD21 form one lower hole set. Two upper holes HU12 and HU22 form another adjacent upper hole set and two lower holes HD12 and HD22 form another adjacent lower hole set. Then, such respective upper hole sets are arranged corresponding to the pads of the semiconductor chip as shown in FIG. 5.

The respective lower hole sets are arranged corresponding to pads of a space transformer (not shown) of a probe card (not shown). Since varying with a pitch between corresponding pads, a pitch between the upper hole sets may be uniform or not.

When a semiconductor chip has a staggered pad structure, as shown in FIG. 5, the upper hole set and the lower hole set are formed of the two upper holes HU11 and HU21 and the two lower holes HD11 and HD21, respectively. For example, when a semiconductor chip has a structure in which pads are arranged in four rows, four upper holes and four lower holes where probes commonly using a center hole are inserted in, respectively, form an upper hole set and a lower hole set, respectively.

In FIG. 5, the two probes PB11 and PB21 to be in contact with the two pads P11 and P21 arranged in the most upper row are commonly inserted in the center hole HC1 of the guide, and the upper holes HU11 and HU21 where the first contact portions UPB11 and UPB21 of the probes PB11 and PB21 are formed in the same direction as that of the arranged pads P11 and P21.

In more detail, an arrangement direction of each of the upper holes HU11 and HU21 belonging to the same upper hole set are identical to a direction of a straight line DL formed by connecting contact points C11 and C21 on the first contact portions UPB11 and UPB21 corresponding to the pads P11 and P21 of the semiconductor chip. An arrangement direction of the lower holes HD11 and HD21 belonging to the same lower hole set is also identical to that of the corresponding upper holes HU11 and HU21.

That is, as shown in FIG. 5, different from general contact methods (refer to FIG. 2), additional holes for the probes PB11 and PB21 in contact with the pads P11 and P21, respectively, are not formed. Also, the upper holes HU11 and HU21 in which the first contact portions UPB11 and UPB21 of the probes PB11 and PB21 in contact with the pads P11 and P21 are inserted are formed in a row parallel to the straight line formed by connecting the pads P11 and P21, the beams BPB11 and BPB21 connected to the first contact portions UPB11 and UPB21 are commonly inserted in the same center hole HC1, and the second contact portions DPB11 and DPB21 connected to the beams BPB11 and BPB21 are arranged in the same direction as that of the upper holes HU11 and HU21.

Figure 2:
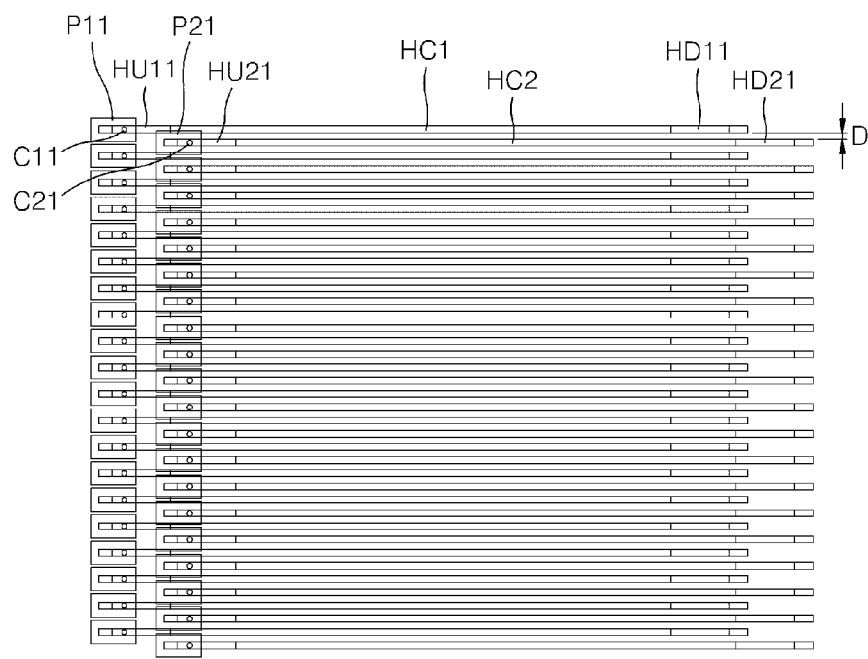
FIG. 2 is a view illustrating probe blocks for test, overlapping the semiconductor chip of FIG. 1.

Since pads of a semiconductor chip having a staggered pad structure are arranged in a series of zigzags, when probes are inserted in one center hole and a plurality of upper holes, respectively, to be in contact with corresponding pads, as shown in FIG. 5, the upper holes, the center hole, and lower holes are formed in a slant more than those shown in FIG. 2.

When the probe block is formed in the same structure as shown in FIG. 5, a distance between walls of adjacent holes (in FIG. 5, a distance D between the center hole HC1 and an adjacent center hole HC2) becomes identical to a distance between holes of a probe block for testing a semiconductor chip having an in-line pad structure. That is, a pitch between holes is two times of a probe block testing as shown in FIG. 2.

As shown in FIG. 7, the center hole HC1 has a panel shape in which a space between neighboring probes is blocked in such a way that the probes PB11 and PB21 only move vertically and the beams BPB11 and BPB21 are inserted. The first contact portions UPB11 and UPB21, the second contact portions DPB11 and DPB21, and the beams BPB11 and BPB21 of the probes PB11 and PB21 are in a flat panel shape with the same thickness.

In the case of the guide G, a space between the upper holes HU11 and HU21 and the lower holes HD11 and HD21 forming one upper hole set and one lower hole set and the center hole HC1 and the upper holes HU12 and HU22 and the lower holes HD12 and HD22 of other upper hole set and lower hole set and the center hole HC2 is blocked.

The third part PLT3 forming the center hole HC1 is formed by assembling one or more unit elements PLT31, PLT32, and PLT33. Though there is shown the third part PLT3 formed of three unit elements PLT31, PLT32, and PLT33 in FIG. 6, a third part may be formed of one or two unit elements.

The first part PLT1 may be formed in a single body with the third part PLT3 and the second part PLT2 may be formed additionally. The second part PLT2 may be formed in a single body with the third part PLT3 and the first part PLT1 may be formed additionally. Also, when it is possible to assemble a probe, the first to third parts PLT1, PLT2, and PLT3 may be formed in a single body, thereby forming the guide G by using a single block.

The beams BPB11 and BPB21 commonly inserted in the center hole HC1 electrically open to each other when the first contact portions UPB11 and UPB21 are in contact with pads. That is, though the first contact portions UPB11 and UPB21 are in contact with corresponding pads, respectively, and there is generated a vertical elastic deformation in the beams BPB 11 and BPB21 due to pressure caused by the contact, the beams BPB11 and BPB21 commonly inserted in one center hole HC1 are not electrically connected to each other. When the first contact portions UPB 11 and UPB21 are pressed by the pads to a certain distance, much the same pressure is given to the first contact portions UPB11 and UPB21, and then, the beams BPB11 and BPB21 are bent to the same degree.

Though there are shown the beams BPB11 and BPB21 are formed to be protruded upward as a smooth curved line in FIG. 6, the shape of the beams BPB11 and BPB21 is irrelevant within a range in which beams are not short-circuited to one another when the first contact portions UPB11 and UPB21 are pressed by the pads to a certain distance in test.

Also, there are formed thresholds to prevent the first contact portions UPB 11 and UPB21 from being protruded further than the upper holes HU11 and HU21 a portion where the first contact portions UPB11 and UPB21 are connected to the beams BPB 11 and BPB21. By the thresholds LK11 and LK21, a degree of protrusion of the first contact portions UPB11 and UPB21 above the upper holes HU11 and HU21 is uniformly adjusted, thereby allowing smoothness of contact points to be uniform.

Figure 8:
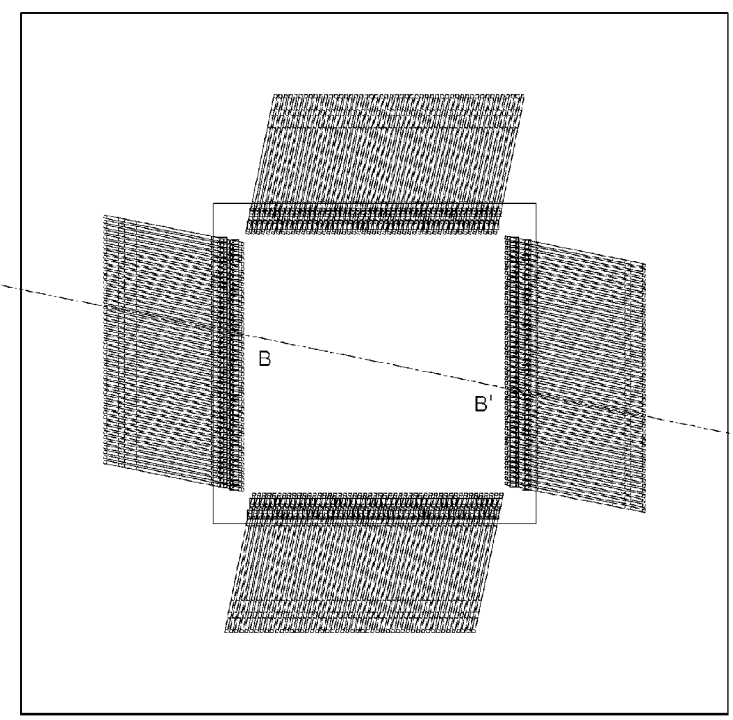
FIG. 8 is a projected top view illustrating a probe block according to an embodiment of the present invention.

FIG. 8 is a projected top view illustrating the probe block according to an embodiment of the present invention.

Figure 9:
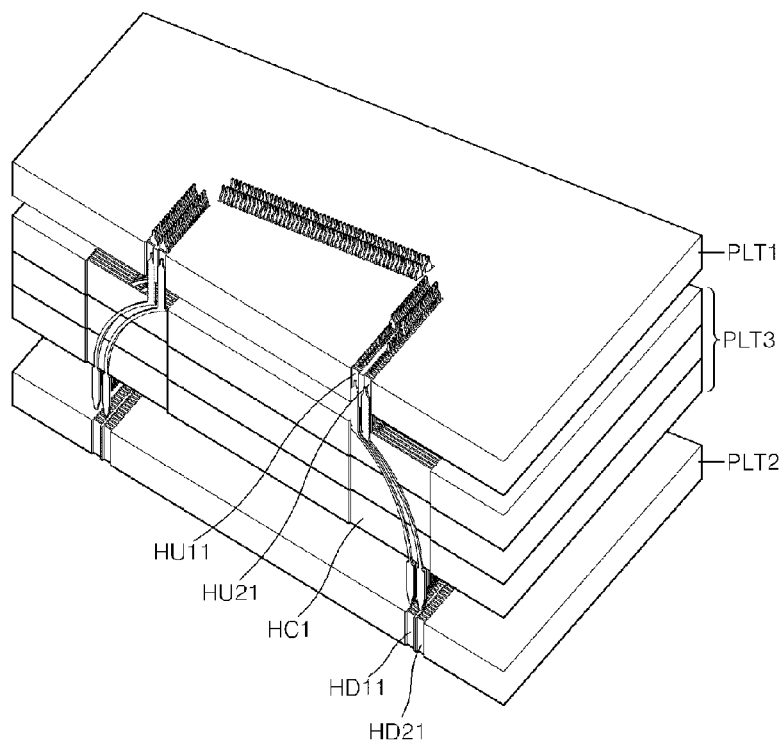

FIG. 9 is a three-dimensional perspective view illustrating the probe block cut along a line B to B' of FIG. 8.

To test a semiconductor chip having a staggered pad structure in which two rows of pads are arranged on both sides, respectively, upper holes, a center hole, and lower holes of the probe block according to an embodiment of the present invention are formed to be slant more than the pads and beams of probes are commonly inserted in one center hole.

Figure 3:
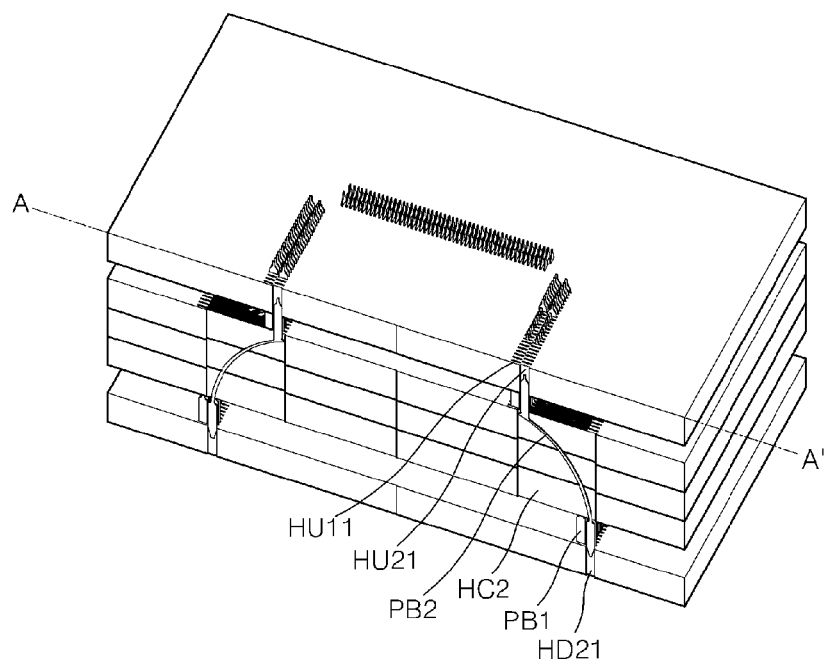
FIG. 3 is a three-dimensional perspective view illustrating a probe block for the semiconductor chip of FIG. 2.
Figure 4:
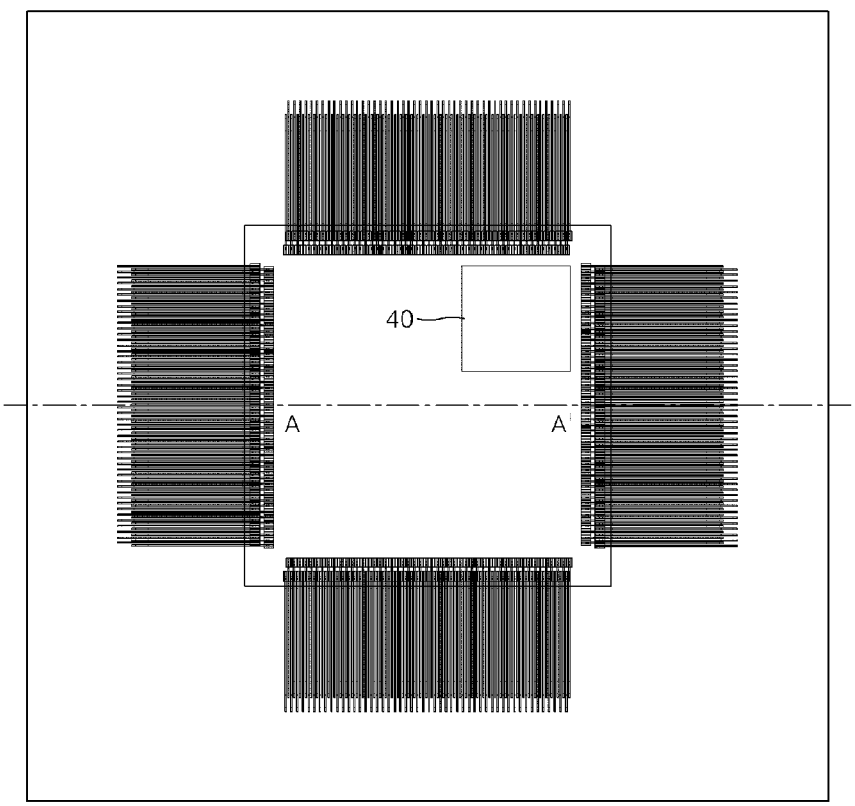
FIG. 4 is a top view illustrating the probe block of FIG. 3.

In FIG. 9, different from a probe block of FIG. 3, the upper holes HU11 and HU21 are arranged in a row without crisscrossing, beams connected to first contact portions inserted in the upper holes HU11 and HU21, respectively, are commonly inserted in one center hole HC1, and second contact portions connected to the beams are divided into the lower holes HD11 and HD21 and inserted therein.

Since probes are inserted in an opposite side as the same structure, a pitch between neighboring guide holes of a probe block for a semiconductor chip with staggered pad arrangement on four sides thereof may become identical to a pitch between neighboring guide holes of a probe block for a semiconductor chip with in-line pad arrangement.

Figure 10:
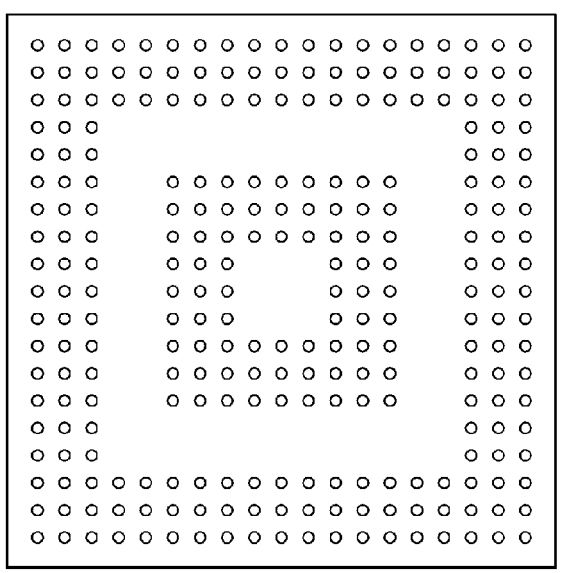
FIG. 10 is a view illustrating a semiconductor chip having a structure in which three or more rows of pads are arranged.

FIG. 10 is a view illustrating a semiconductor chip having a structure in which three or more rows of pads are arranged.

Figure 11:
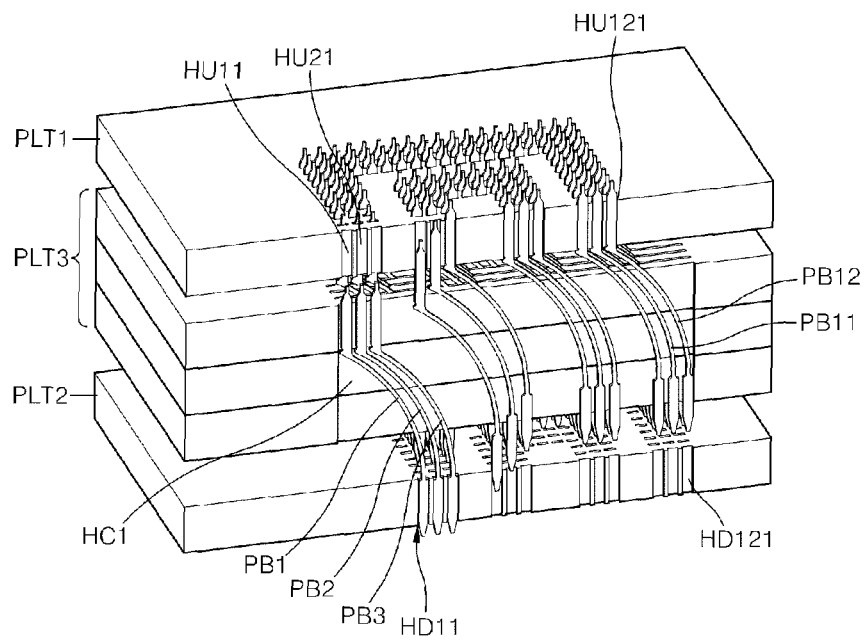
FIG. 11 is an incised three-dimensional perspective view illustrating a probe block according to an embodiment of the present invention for testing the semiconductor chip of FIG. 10.

FIG. 11 is a three-dimensional perspective view illustrating the probe block according to the present invention for testing the semiconductor chip of FIG. 10.

In FIG. 10, there is shown a chip having a wafer level chip scale packaging (WLCSP) structure. Pads are arranged in three rows surrounding the edge of the chip, and pads in three rows are disposed therein.

When using the probe block for the semiconductor chip having such structure, it is possible to embody a pitch between probes to be identical to a pitch between neighboring guide holes of a probe block for a semiconductor chip with in-line pad arrangement.

That is, as shown in FIG. 11, upper holes HU11, HU21, . . . and HU121 are formed in the first part PLT1, respectively, and lower holes HD11, HD21, . . . and HD121 are formed in the second part PLT2, respectively. Beams of probes PB1, PB2, . . . and PB 12, inserted in the upper holes HU11, HU21, . . . and HU121 and the lower holes HD11, HD21, . . . and HD121, are commonly inserted in one center hole HC1 formed in the third part PLT3. The probes PB 1, PB2, . . . and PB 12 inserted in the center hole HC1 are shown as identical to one another with the same curvature and radius of rotation not to be electrically connected to one another when pressed to a certain distance by pads in contact therewith. However, either of a shape or a curvature is not irrelevant in design within a range in which probes are not electrically connected to one another.

As shown in FIG. 11, the probe block according to an embodiment of the present invention may not only allow the pitch between neighboring guide holes to be wide but also be effectively applied to a structure in which a plurality of pads are arranged.

As described above, exemplary embodiments have been shown and described.

Though specific terms are used herein, they are just used for describing the present invention but do not limit the meanings and the scope of the present invention disclosed in the claims. Therefore, it would be appreciated by those skilled in the art that changes may be made to these embodiments without departing from the principles and spirit of the invention. Accordingly, the technical scope of the present invention is defined by the claims and their equivalents.

INDUSTRIAL APPLICABILITY

This invention can be applied to the field of semiconductor inspection device.

The invention claimed is:

1. A probe block comprising:
a plurality of probes, each probe comprising a first contact portion, a second contact portion, and a curved beam connecting the first contact portion to the second contact portion, wherein the first contact portion and the second contact portion are not vertically aligned, and
a guide supporting the plurality of probes, the guide comprising:
a first part comprising a plurality of upper holes, wherein the first contact portion of a probe is inserted therein to penetrate;
a second part comprising a plurality of lower holes, wherein the second contact portion of the probe is inserted therein to penetrate; and
a third part comprising a plurality of center holes, wherein the third part is disposed between the first part and the second part in contact with the first part and the second part, and wherein each center hole encloses curved beams of one or more probes in a manner that the curved beams of the one or more probes are not exposed to beams of other probes, wherein the one or more upper holes and the one or more lower holes are located on a plane vertically extended from the center hole, wherein the first contact portion, the second contact portion and the curved beam of the probe have a panel-shaped structure, and wherein the probe has a threshold to restrict a movement of the first contact portion.

2. The probe block of claim 1, wherein the plurality of upper holes and the plurality of lower holes form an upper hole set and a lower hole set, respectively, and wherein a plurality of the upper hole sets is arranged corresponding to pads of a semiconductor chip and a plurality of the lower hole sets is arranged corresponding to pads of a space transformer.

3. The probe block of claim 2, wherein an arranged direction of the respective upper holes belonging to the upper hole set is identical to a direction of a straight line formed by connecting contact points of the first contact portion, corresponding to the pads of the semiconductor chip, and wherein an arranged direction of the lower holes belonging to the lower hole set is identical to that of the upper holes.

4. The probe block of claim 3, wherein, when the semiconductor chip has a staggered pad structure, the upper hole set and the lower hole set are formed of two upper holes and two lower holes, respectively.

5. The probe block of claim 1, wherein the third part comprising a center hole is formed by assembling one or more unit elements. single body with the third part.

6. The probe block of claim 1, wherein the first part is formed in a single body with the third part, or the second part is formed in a single body with the third part.

7. The probe block of claim 1, wherein the first, second and third parts are formed in a single body.

* * * * *